(12) United States Patent
Peters

(10) Patent No.: US 11,219,121 B2
(45) Date of Patent: Jan. 4, 2022

(54) CIRCUIT BOARD ASSEMBLY WITH ELECTRONIC SURFACE MOUNT DEVICE AND MOUNT ARRANGEMENT FOR THERMAL PROTECTION

(71) Applicant: HONEYWELL INTERNATIONAL INC., Morris Plains, NJ (US)

(72) Inventor: Scott A. Peters, Phoenix, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 16 days.

(21) Appl. No.: 16/737,375

(22) Filed: Jan. 8, 2020

(65) Prior Publication Data

US 2021/0212200 A1 Jul. 8, 2021

(51) Int. Cl.

| H01L 27/108 | (2006.01) |
|---|---|
| H05K 1/02 | (2006.01) |
| H05K 3/34 | (2006.01) |
| H01G 2/06 | (2006.01) |
| H01G 4/12 | (2006.01) |
| H01G 4/228 | (2006.01) |
| H01L 23/52 | (2006.01) |

(52) U.S. Cl.
CPC .......... *H05K 1/0271* (2013.01); *H01G 2/065* (2013.01); *H01G 4/12* (2013.01); *H01G 4/228* (2013.01); *H01L 23/52* (2013.01); *H05K 3/3426* (2013.01); *H05K 2201/068* (2013.01); *H05K 2201/10909* (2013.01)

(58) Field of Classification Search
CPC .......... H01L 23/52; H01G 2/065; H01G 4/12; H01G 4/228; H01G 4/232; H01G 4/2325; H01G 4/38; H05K 1/0271; H05K 3/3426
USPC ........................................ 257/308
See application file for complete search history.

(56) References Cited

U.S. PATENT DOCUMENTS

| 6,081,416 A * | 6/2000 | Trinh ................. H01G 4/12 361/308.1 |
|---|---|---|
| 9,198,295 B2 | 11/2015 | Lhommeau |
| 9,754,928 B2 | 9/2017 | Chen et al. |
| 2001/0001258 A1 * | 5/2001 | Ishigaki ............. H01G 4/232 361/502 |
| 2007/0035939 A1 | 2/2007 | Wallace et al. |

FOREIGN PATENT DOCUMENTS

JP 2016535445 A 11/2016

* cited by examiner

*Primary Examiner* — Brook Kebede
(74) *Attorney, Agent, or Firm* — Lorenz & Kopf, LLP

(57) ABSTRACT

A circuit board assembly includes a circuit board, an electronic surface mount device (SMD), and a spacer that attaches the SMD to the circuit board. A coefficient of thermal expansion (CTE) of the spacer is closer to a CTE of the SMD than a CTE of the circuit board. The circuit board assembly also includes a flexible electrical lead that extends between and that is electrically connected to the SMD and the electrical node of the circuit board. Methods of manufacturing the circuit board assembly include selectively heating joining material at a predetermined heating rate and selectively cooling the joining material at a predetermined cooling rate to attach the flexible electrical leads to the SMD and the circuit board.

10 Claims, 7 Drawing Sheets

CIRCUIT BOARD ASSEMBLY WITH ELECTRONIC SURFACE MOUNT DEVICE AND MOUNT ARRANGEMENT FOR THERMAL PROTECTION

TECHNICAL FIELD

The present disclosure generally relates to circuit board assemblies with electronic surface mount devices and, more particularly, relates to circuit board assemblies with an electronic surface mount device (SMD) and a mount arrangement for thermal protection of the SMD. Systems and methods of manufacturing these circuit board assemblies are also disclosed.

BACKGROUND

Circuit board assemblies often include a printed circuit board and a plurality of electronic surface mount devices (SMDs), such as capacitors, resistors, etc. that are mounted directly to the surface of the printed circuit board. These assemblies are used in a wide variety of devices.

However, there may be difficulty in manufacturing these circuit board assemblies without inducing internal stresses and/or causing thermal shock to the SMD. Likewise, because the circuit board and the SMD often have largely different coefficients of thermal expansion, there may be difficulty in avoiding thermal shock to the SMD during the operating life of the circuit board assembly. Repair and replacement of SMDs on existing circuit board assemblies may also present difficulties due to the thermal sensitivities of the SMDs.

Accordingly, there remains a need for an improved SMD mount arrangement that reduces thermal stresses on the SMD during manufacture and/or use of a circuit board assembly. There are also needs for improved manufacturing methods and systems for making the same. Other desirable features and characteristics of the present disclosure will become apparent from the subsequent detailed description and the appended claims, taken in conjunction with the accompanying drawings and the foregoing technical field and background.

BRIEF SUMMARY

In one embodiment, a method of manufacturing a circuit board assembly is disclosed. The method includes attaching a flexible electrical lead to an electronic surface mount device (SMD) with a joining material, including selectively heating the joining material at a predetermined heating rate and selectively cooling the joining material at a predetermined cooling rate. The method also includes attaching the SMD to a mount area of a circuit board using a spacer that is interposed between the mount area and the SMD. The spacer spaces the SMD at a distance from the mount area. A coefficient of thermal expansion (CTE) of the spacer is closer to a CTE of the SMD than a CTE of the circuit board. Moreover, the method includes attaching the flexible electrical lead to an electrical node of the circuit board.

In another aspect, a circuit board assembly is disclosed that includes a circuit board with a mount area and an electrical node. The circuit board assembly also includes an electronic surface mount device (SMD). The circuit board assembly further includes a spacer that attaches the SMD to the mount area of the circuit board and that spaces the SMD at a distance from the mount area. A coefficient of thermal expansion (CTE) of the spacer is closer to a CTE of the SMD than a CTE of the circuit board. Moreover, the circuit board assembly includes a flexible electrical lead that extends between and that is electrically connected to the SMD and the electrical node of the circuit board.

In a further aspect, a manufacturing system for manufacture of a circuit board assembly is disclosed. The system includes a fixture that supports an electronic surface mount device (SMD), a flexible electrical lead, and a joining material together. The system also includes a temperature control unit that selectively controls a temperature of the joining material while the fixture supports the SMD, the electrical lead, and the joining material. The temperature control unit is configured to selectively heat the joining material at a predetermined heating rate to melt the joining material, and to selectively cool the joining material at a predetermined cooling rate to re-solidify the joining material, thereby attaching the SMD and the electrical lead. The temperature control unit is configured to selectively melt and re-solidify a node material of a circuit board while the SMD is attached to a spacer that is interposed between the SMD and the circuit board. The temperature control unit is configured to selectively heat the node material at the predetermined heating rate to melt the node material, and to selectively cool the node material at the predetermined cooling rate to re-solidify the node material, thereby attaching the electrical lead to an electrical node of the circuit board with the spacer spacing the SMD at a distance from a mount area of the circuit board.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1:
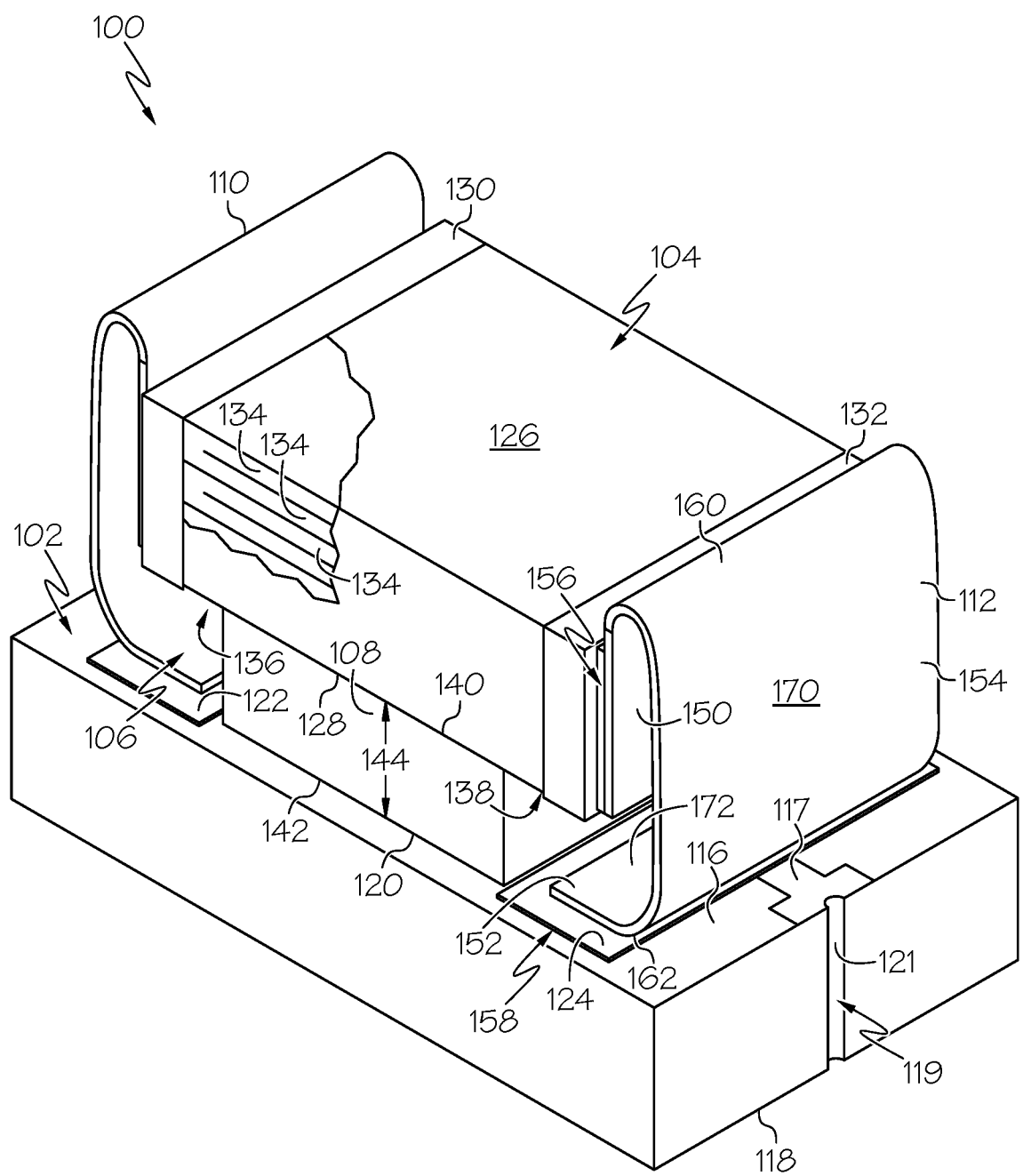
FIG. 1 is a perspective view of a circuit board assembly according to example embodiments of the present disclosure.

Referring to FIG. 1, a circuit board assembly 100 is shown according to example embodiments of the present disclosure. Those having ordinary skill in the art will appreciate that the circuit board assembly 100 of FIG. 1 may constitute a part of a larger electrical circuit of a printed circuit board assembly. In some embodiments, the circuit board assembly 100 may be incorporated within a control system of an aircraft or other vehicle; however, it will be appreciated that the circuit board assembly 100 may be incorporated within other electrical systems without departing from the scope of the present disclosure.

The circuit board assembly 100 may generally include a circuit board 102, an electronic surface mount device (SMD) 104, and a mount arrangement 106. The SMD 104 may be one of a variety of devices, such as a capacitor, a resistor, etc. The SMD 104 may be a known device that is typically mounted directly to the board 102. However, in embodiments of the present disclosure, the mount arrangement 106 may support the SMD 104, mechanically attach it to the circuit board 102, and maintain the SMD 104 separated at a distance from the circuit board 102. Also, the mount arrangement 106 may electrically connect the SMD 104 within circuitry of the circuit board 102.

Furthermore, the mount arrangement 106 may protect the SMD 104 from damage due to thermal conditions. Specifically, the mount arrangement 106 may protect the SMD 104 against stress and/or fracture due to differences in thermal expansion between the SMD 104 and the circuit board 102. Also, because of the mount arrangement 106, installation of the SMD 104 onto the circuit board 102 is unlikely to impart internal stresses on the SMD 104.

The mount arrangement 106 also facilitates manufacture of the circuit board assembly 100. The mount arrangement 106 may be used in newly designed assemblies 100. The mount arrangement 106 may also be used when repairing and replacing SMDs 104 on conventional circuit board assemblies 100.

The circuit board assembly 100 will now be discussed in detail according to example embodiments. It will be appreciated that the circuit board assembly 100 may vary from those shown and described without departing from the scope of the present disclosure.

The circuit board 102 may be a printed circuit board that is relatively flat and thin. The circuit board 102 may be a printed circuit board with a top surface 116 and a bottom surface 118. The top surface 116 may include a plurality of electrically conductive traces 117 that electrically connect the SMD 104 into a larger circuit. One exemplary trace 117 is shown in FIG. 1 and extends to a through-hole 119 of the circuit board 102. The through-hole 119 may extend from the top surface 116 to the bottom surface 118. An electrically conductive vertical trace 121 may define the through-hole to provide an electrical path between the SMD 104 and traces and/or other circuit elements supported on the bottom surface 118. The top surface 116 may also define a mount area 120. The mount area 120 may be relatively flat and smooth. In FIG. 1, the mount area 120 is substantially rectangular. The top surface 116 may additionally include electrical nodes, such as a first node 122 and a second node 124, which are spaced apart horizontally with the mount areas 120 disposed therebetween. The nodes 122, 124 may be flat, rectangular plates (i.e., electrode pads, etc.) made of conductive material. As shown in FIG. 1, the second node 124 may be disposed at one end of the trace 117 and spaced apart from the through-hole 119. Thus, the trace 117 and the vertical trace 121 may electrically connect the second node 124 within the electrical circuit of the assembly 100. Although not shown, the first node 122 may have respective traces 117, 121 (and a respective through hole 119) for electrically connecting the first node 122 within the circuit of the circuit board assembly 100. The traces 117, 121 and the nodes 122, 122 may be made of a known electrically conductive material.

The SMD 104 may be cuboid in shape and may include a top side 126 that faces away from the circuit board 102 and a bottom side 128 that faces toward the circuit board 102. The SMD 104 may also include electrical terminals, such as a first terminal end 130 and a second terminal end 132, which are disposed on opposite horizontal sides of the SMD 104 and which extend generally in the vertical direction with respect to the circuit board 102. As such, the SMD 104 may be a so-called "leadless" SMD 104 (i.e., without leads) in some embodiments. In some embodiments, the SMD 104 may be a capacitor, such as a multi-layer ceramic chip (MLCC) capacitor. Accordingly, the SMD 104 may include a plurality of layers 134. The layers 134 may be substantially flat and planar and arranged in overlapping, layered arrangement. The SMD 104 may be arranged with the layers 134 substantially parallel to the top surface 116 of the circuit board 102. The layers 134 may be made primarily from a ceramic material. In some embodiments, the coefficient of thermal expansion (CTE) of the SMD 104 may be between seven (7) ppm/° C. and eleven and one-half (11.5) ppm/° C. Also, the SMD 104 may be relatively rigid and inflexible. Also, it will be appreciated that the SMD 104 may be a leadless component with the terminal ends 130, 132 providing electrical connection for the layers 134 of the SMD 104.

As mentioned above, the SMD 104 may be mechanically supported on the circuit board 102 and electrically connected within the respective circuit via the mount arrangement 106. In some embodiments, the mount arrangement 106 may generally include a spacer 108. Also, in some embodiments, the mount arrangement 106 may include one or more flexible electrical leads, such as a first lead 110 and a second lead 112.

The spacer 108 may be cuboid in shape and may include an upper side 140 and a lower side 142. The spacer 108 may have a substantially constant thickness such that the upper side 140 and the lower side 142 are substantially parallel. In some embodiments, the thickness of the spacer 108 (measured between the upper side 140 and the lower side 142) may be between approximately 0.050 inches and 0.060 inches; however, the thickness may be different from these embodiments. The thickness of the spacer 108 may be chosen based on the dimensions of the other components and/or space availability. Furthermore, the thickness of the spacer 108 may be chosen to facilitate attachment of the leads 110, 112. Moreover, the thickness of the spacer 108 may be selected so that the spacer 108 provides predetermined thermal performance. The lower side 142 of the spacer 108 may face the circuit board 102, and the upper side 140 may face the SMD 104. The lower side 142 may overlay (i.e., may be layered flat over) the mount area 120 of the circuit board 102. The lower side 142 may be bonded and attached to the mount area 120 of the circuit board 102 with the upper and lower sides 140, 142 parallel to the top surface 116. The bottom side 128 of the SMD 104 may overlay and may be layered flat over the upper side 140 of the spacer 108. Accordingly, the spacer 108 attaches the SMD 104 to the mount area 120 of the circuit board 102 and spaces the SMD 104 at a distance 144 from the mount area 120.

The spacer 108 may be made from a stiff, strong, and rigid material, such as a ceramic. The spacer 108 may be made from a ceramic material, such as alumina ceramic (Aluminum Oxide), in some embodiments. The coefficient of thermal expansion may be between approximately seven (7) ppm/° C. and eleven and one-half (11.5) ppm/° C.

In some embodiments, the spacer 108 and the SMD 104 may exhibit similar material characteristics. The spacer 108 and the SMD 104 may be selected and constructed to exhibit similar thermal characteristics. In some embodiments, the spacer 108 and the SMD 104 may have substantially similar coefficients of thermal expansion (CTE). Stated differently, the spacer 108 and the SMD 104 may have CTEs that fall within a predetermined range or percentage of each other. For example, the spacer 108 CTE may be at least 60% of the CTE of the SMD 104. Additionally, the CTE of the spacer 108 may be, at most, equal to the CTE of the SMD 104. In some embodiments, the CTE of the spacer 108 may be lower than the CTE of the SMD 104 and within the predetermined range. Also, as will be discussed, the CTE of the spacer 108 may be closer to the CTE off the SMD 104 than the CTE of the circuit board 102. The CTE of the spacer 108 and SMD 104 may be significantly lower (e.g., an order of magnitude lower) than that of the circuit board 102 in some embodiments.

In some embodiments, the SMD 104 may be formed with a ceramic material such that the CTE of the SMD 104 is between approximately 9.5 to 11.5 ppm/° C. In addition, the spacer 108 may be formed of Alumina such that the CTE of the spacer 108 is approximately 7 ppm/° C. Thus, in these embodiments, the CTE of the spacer 108 is approximately 61% of the CTE of the SMD 104. Because of the relative similarity of CTEs, and because the SMD 104 is spaced away from the circuit board 102, thermal loads from the circuit board 102 onto the spacer 108 are unlikely to transfer to the SMD 104.

Furthermore, it is known that ceramics (like those of the SMD 104) are less likely to fracture under compression loads in comparison with tensile loads. In the above embodiments, the CTE of the spacer 108 is slightly lower than that of the SMD 104. Thus, even if the SMD 104 thermally expands at a slightly higher rate than the spacer 108, the spacer 108 may impart compressive stress on the SMD 104. Such loading is likely to be minimal. As such, the SMD 104 may better withstand thermal loads during manufacture and/or during the installed, operating life of the SMD 104.

In additional embodiments, the spacer 108 and the SMD 104 may be constructed from the same material to exhibit similar thermal behavior in some embodiments. For example, a majority of both the spacer 108 and the SMD 104 may be constructed from alumina ceramic (Aluminum Oxide) in some embodiments.

In some embodiments, the surface area of the bottom side 128 may be larger than the surface area of the upper side 140 such that the SMD 104 overhangs the spacer 108. As shown in the embodiment of FIG. 1, the SMD 104 may have a first overhanging portion 136, which overhangs one side of the spacer 108. The first overhanging portion 136 may include the first terminal end 130 and part of the layered portion of the SMD 104. Also, the SMD 104 may have a second overhanging portion 138, which overhangs the opposite side of the spacer 108. The second overhanging portion may include the second terminal end 132 and another part of the layered portion of the SMD 104.

Accordingly, the spacer 108 of the mount arrangement 106 may provide strong and rigid support for the SMD 104 on the circuit board 102. Also, the spacer 108 may provide thermal protection for the SMD 104. For example, if the SMD 104 and the circuit board 102 thermally expand at different rates, the spacer 108 may limit transfer of stress to the SMD 104 and prevent internal stresses from being imparted onto the SMD 104.

Furthermore, the mount arrangement 106 may include the first lead 110 and the second lead 112. The leads 110, 112 may be flexible. The leads 110, 112 may include and/or may be constructed from conductive material. The leads 110, 112 may be formed from and/or may include annealed copper in some embodiments to provide high flexibility and electrical conductivity for the leads 110, 112.

The leads 110, 112 may be substantially similar except that the first lead 110 extends between and electrically connects the first terminal end 130 and the first node 122 whereas the second lead 112 extends between and electrically connects the second terminal end 132 and the second node 124. Features of the second lead 112 discussed below may also be included as features of the first lead 114.

The lead 112 may be a relatively flat and elongate strap (i.e., band, strip, flap, belt, etc.) of conductive material with an outer side 170 and an inner side 172. The lead 112 may have a thickness (measured between the outer and inner sides 170, 172) between 0.002 and 0.004 inches. Also, the lead 112 may extend longitudinally between the second terminal end 132 of the SMD 104 and the node 124 of the circuit board 102. More specifically, the lead 112 may include a device connection end 150, which is layered on, overlapped over, and attached (mechanically and electrically) to the second terminal end 132 to define a first connection 156 (first electrical connection of the circuit board assembly 100). As such, the outer side 170 faces the second terminal end 132 at the first connection 156, and the inner side 172 faces away from the second terminal end 132 at the first connection 156. Moreover, the device connection end 150 may extend in the vertical direction relative to the top surface 116 of the circuit board 102 at the first connection 156. The lead 112 may also include a board connection end 152, which is layered on, overlapped over, and attached (mechanically and electrically) to the second node 124 to define a second connection 158 (second electrical connection of the circuit board assembly 100). As such, the outer side 170 faces the second node 124 at the second connection 158, and the inner side 172 faces away from the second node 124 at the second connection 158. Moreover, the board connection end 152 may extend in the horizontal direction (across the circuit board 102 and substantially normal to the device connection end 150) relative to the top surface 116 of the circuit board 102 at the second connection 158. The lead 112 further includes an intermediate portion 154 that extends between the device connection end 150 and the board connection end 152.

The intermediate portion 154 may extend nonlinearly between the connection end 150 and the board connection end 152 in some embodiments. Also, one or more segments of the intermediate portion 154 may curve (contour) gradually from the device connection end 150 and the board connection end 152 as shown in FIG. 1. For example, the intermediate portion 154 may extend vertically away from the device connection end 150 and the circuit board 102. The intermediate portion 154 may also include a first bend 160 that is proximate the device connection end 150. The first bend 160 may be an approximately one-hundred-eighty degree (180°) gradual, nonlinear contoured bend 160 such that the intermediate portion 154 extends vertically away from the device connection end 150 and returns toward the circuit board 102 and the board connection end 152. The intermediate portion 154 may further include a second bend 162 that is proximate the board connection end 152. The second bend 162 may be an approximately ninety degree (90°) contoured bend 162 such that the intermediate portion 154 extends horizontally along the circuit board 102 and toward the board connection end 152. As shown, the device connection end 150 may be disposed directly above and may extend transverse relative to the board connection end 152. Also, the board connection end 152 may be disposed between the device connection end 150 and the circuit board 102 in the vertical direction. Accordingly, the circuit board assembly 100 may be compact due to the overlapping and transverse arrangement of the board connection end 153 and the device connection end 152.

Also, the intermediate portion 154 may extend freely between the device connection end 150 and the board connection end 152. In other words, the intermediate portion 154 may be free of and unattached from the SMD 104 and the circuit board 102.

Accordingly, the intermediate portion 154 may resiliently flex, for example, in response to thermal expansion and/or contraction of the circuit board 102. This may occur when the circuit board assembly 100 is installed and operational. For example, in some embodiments, the circuit board assembly 100 may be part of a space vehicle and used in-orbit where ambient temperatures cyclically fluctuate, causing the circuit board 102 to thermally expand and contract. The leads 110, 112 may resiliently flex in response to this thermal expansion/contraction without imparting stress on the SMD 104. The circuit board 102 may also thermally expand/contract during manufacture of the assembly 100. For example, solder or other conductive material may be melted and re-solidified during manufacture of the circuit board assembly 100, and/or during manufacture of the larger assembly that includes the circuit board assembly 100, causing the circuit board 102 to thermally expand and contract. The leads 110, 112 may resiliently flex in response to this thermal expansion/contraction of the circuit board 102 without imparting stress on the SMD 104.

Additionally, the intermediate portion 154 may resiliently flex to protect the SMD 104 under other types of loads as well. For example, the intermediate portion 154 may flex due to vibration of the circuit board 102.

The leads 110, 112 and the spacer 108 of the mount arrangement 106 may work in concert to protect the SMD 104 from damage. As stated, the leads 110, 112 may resiliently flex in response to a thermal load without imparting stress on the SMD 104. In addition, the spacer 108 may provide strong and rigid support for the SMD 104 while also providing thermal protection for the SMD 104. For example, if the SMD 104 and the circuit board 102 thermally expand at different rates, the spacer 108 may limit transfer of stress to the SMD 104 and prevent internal stresses from being imparted onto the SMD 104. The spacer 108 may withstand thermal loading at the mount area 120 and avoid transferring this stress to the SMD 104, thereby providing protection from such thermal loading. Thus, even if the SMD 104 is sensitive to thermal shock, the mount arrangement 106 may protect against damage, and the mount arrangement 106 may be highly robust. Moreover, the SMD 104 may be protected from mechanical stress from deflections of the circuit board 102 (e.g., due to vibration loads). There is a reduced amount of area of the SMD 104 in contact with the circuit board 102, which results in a reduced amount of deflection area of the circuit board 102. Also, the leads 110, 112 may deflect due to vibration of the board 102 without imparting stress on the SMD 104.

Referring now to FIGS. 2-7, a method 200 of manufacturing the circuit board assembly 100 will be discussed according to example embodiments. As will be discussed, a manufacturing system 300 of the type represented in FIG. 4 may be used according to the method 200 for manufacturing the circuit board assembly 100 of the present disclosure. In some embodiments, one or more aspects of the method 200 may be performed manually (by hand). In additional embodiments, one or more aspects of the method 200 may be performed automatically. In the latter embodiments, the manufacturing system 300 may include a control system 400 (FIG. 4) for controlling one or more actuators, handling devices, temperature control unit(s), etc. for handling, moving, arranging, heating, and/or cooling the components of the circuit board assembly 100. The control system 400 may be a computerized system with hardware and software comprising one or more processors, sensors, computerized memory units, user input/output devices, etc. The control system 400 may receive input (e.g., from sensors), process the input, and generate control commands that are output to the actuators, heaters, coolers, and/or other components of the manufacturing system 300.

Figure 2:
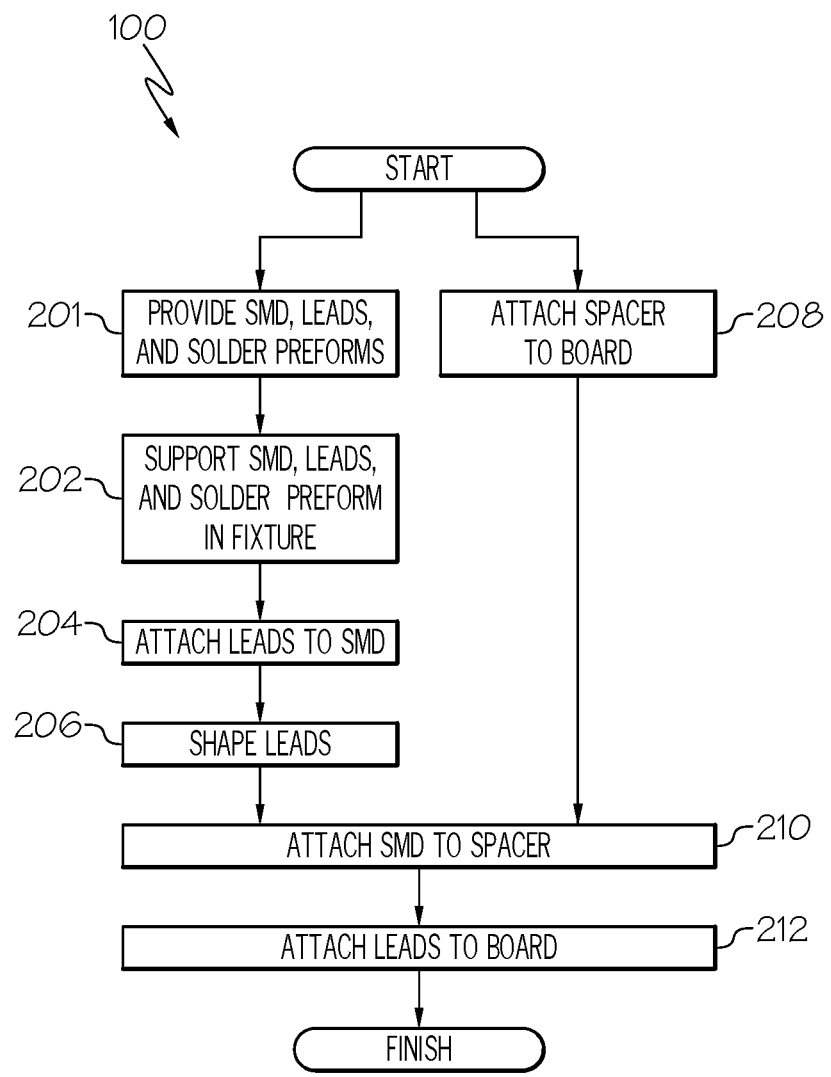
FIG. 2 is a flowchart illustrating a method of manufacturing the circuit board assembly of FIG. 1.
Figure 3:
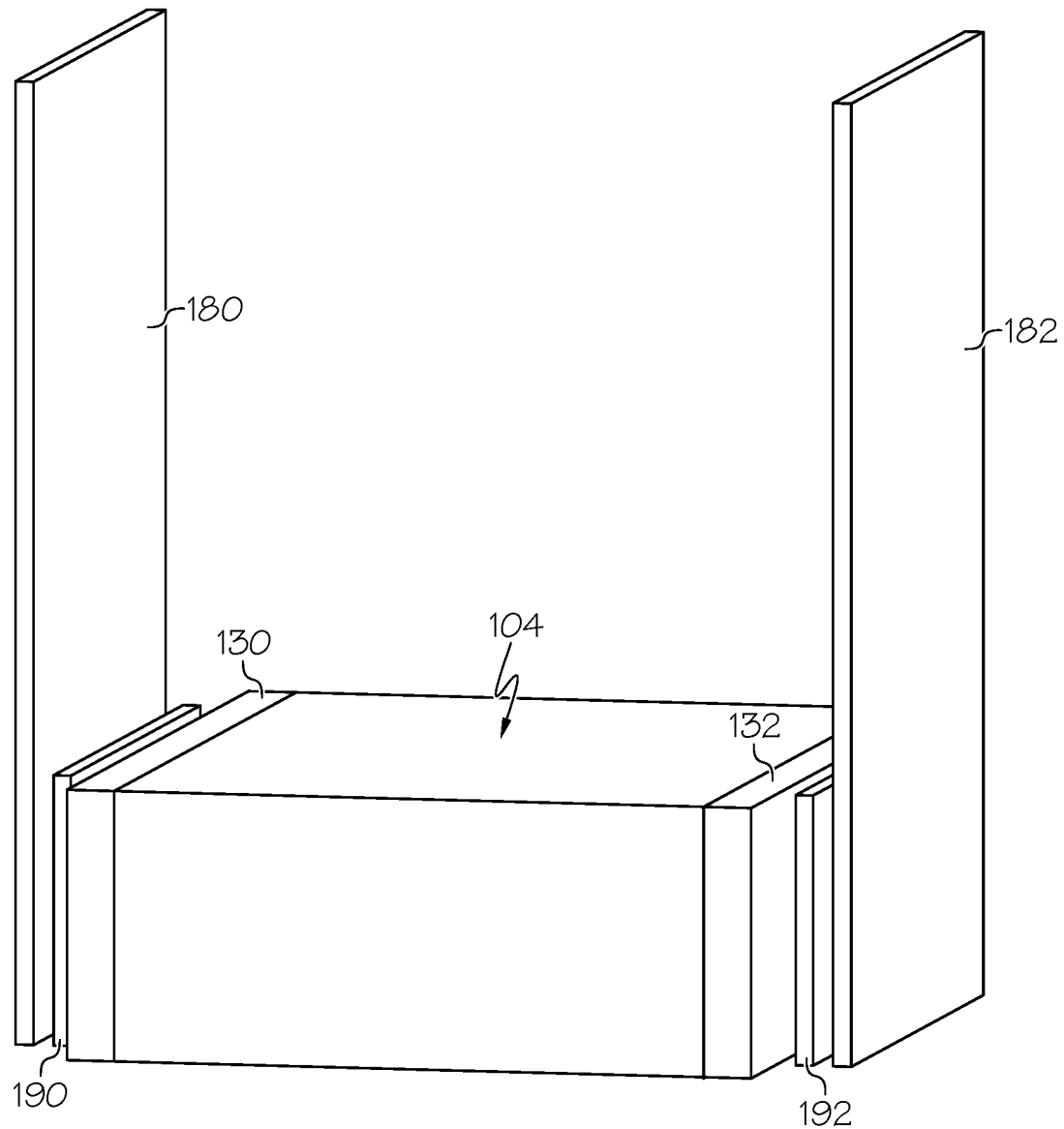
FIG. 3 is a perspective view of a SMD, electrical leads, and other components shown during manufacture of the circuit board assembly of FIG. 1.

As shown in FIGS. 2 and 3, the method 200 may begin at 201, where the SMD 104, a first lead preform 180, a second lead preform 182, a first solder preform 190, and a second solder preform 192 are provided. As represented in FIG. 3, the first and second lead preforms 180, 182 may be elongate, flat straps (bands, strips, flaps, belts, etc.) that extend linearly. As will be discussed, the first lead preform 180 may be shaped into the first lead 110 and attached to the SMD 104 and circuit board 102 using the method 200. Also, the second lead preform 182 may be shaped into the second lead 112 and attached to the SMD 104 and circuit board 102. Moreover, the first and second solder preforms 190, 192 may be solid, flat, thin pieces of solder material or other electrically-conductive joining material. In some embodiments, the first and second solder preforms 190, 192 may be approximately the same size as the first and second terminals ends 130, 132, respectively.

Figure 4:
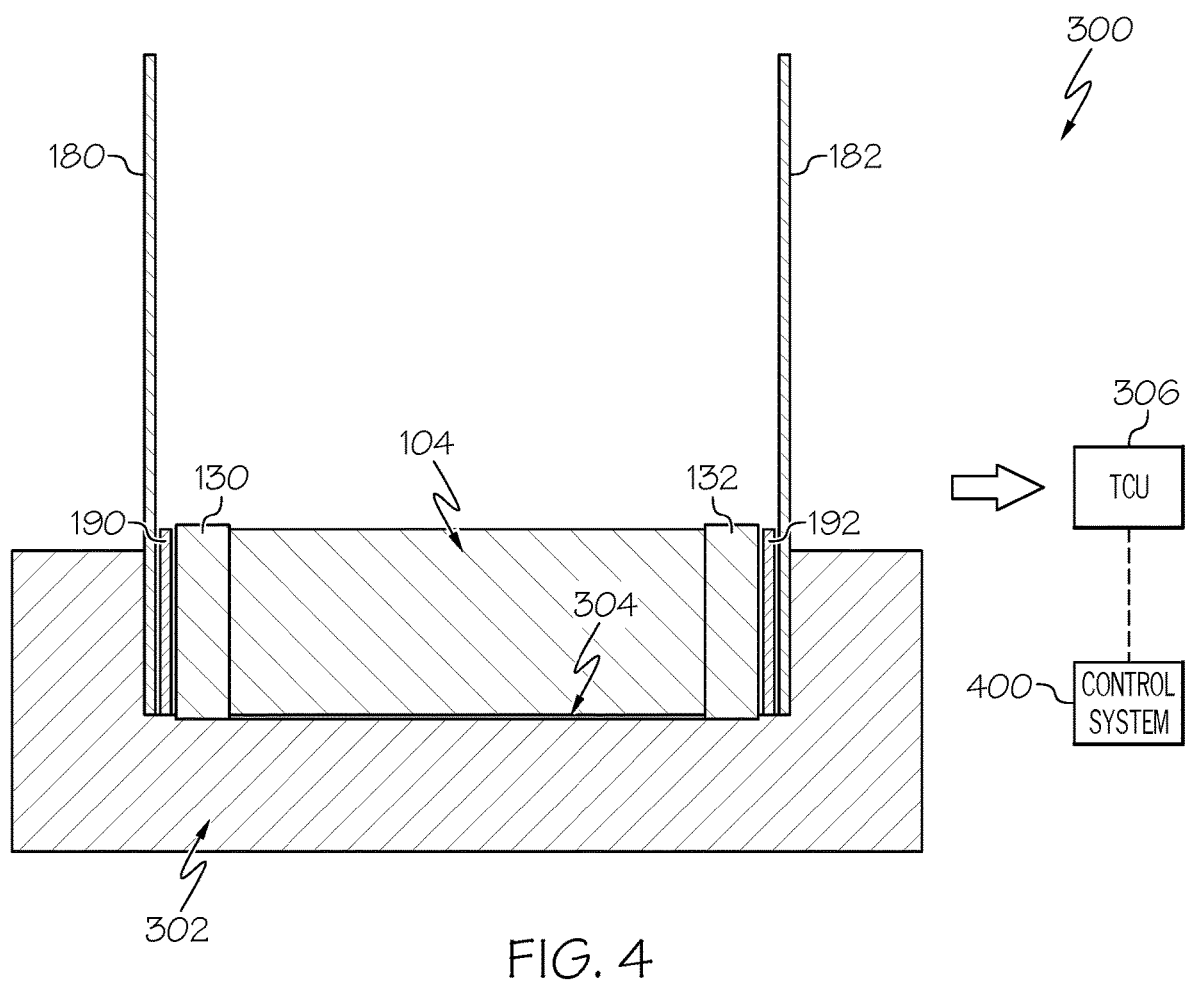
FIG. 4 is a longitudinal section view of components of a manufacturing system for joining the components of FIG. 3.

The method 200 may continue at 202, wherein the SMD 104, the first lead preform 180, the second lead preform 182, the first solder preform 190, and the second solder preform 192 are supported by a fixture 302 of the manufacturing system 300 (FIG. 4). In some embodiments, the fixture 302 may be a box-like member with a recess 304 defined therein. The SMD 104 may be received centrally within the recess 304. The first and second lead preforms 180, 182 may be supported within the recess 304 on opposite sides of the SMD 104. The first solder preform 190 may also be received within the recess 304 between the first terminal end 130 and the first lead preform 180. The second solder preform 192 may be received within the recess 304 between the second terminal end 132 and the second lead preform 182. The recess 304 may be shaped and sized such that SMD 104, the first lead preform 180, the second lead preform 182, the first solder preform 190, and the second solder preform 192 are tightly arranged (with little-to-no intervening gaps). Also, the recess 304 may be sized such that SMD 104, the first lead preform 180, the second lead preform 182, the first solder preform 190, and the second solder preform 192 may be supported free-standing under the force of gravity alone on the fixture 302. In some embodiments, the recess 304 may have horizontal dimensions that cause SMD 104, the first lead preform 180, the second lead preform 182, the first solder preform 190, and the second solder preform 192 to be slightly compressed together horizontally.

Figure 5:
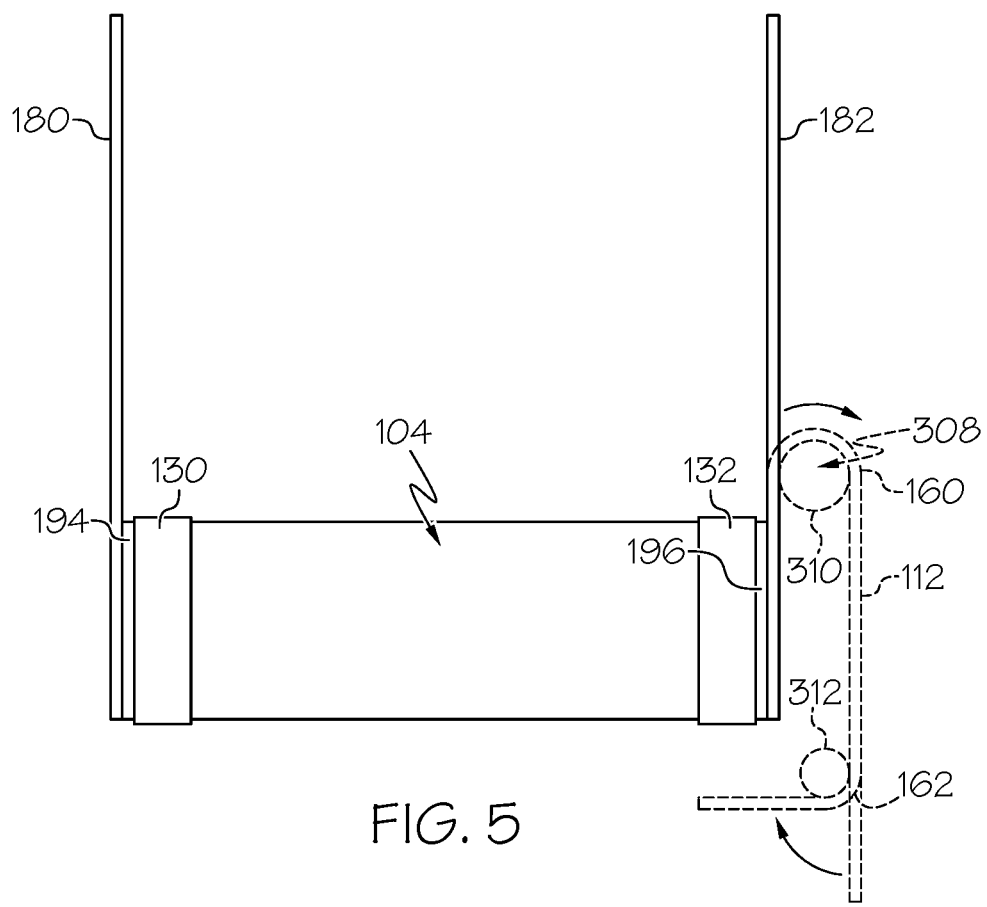
FIG. 5 is a side view of the components of FIG. 3 shown attached together.

Furthermore, the method 200 may continue at 204, wherein the SMD 104, the first lead preform 180, the second lead preform 182, the first solder preform 190, and the second solder preform 192 are mechanically attached and electrically connected. In some embodiments, a temperature control unit 306 (TCU) may be employed for this purpose. The TCU 306 may include one or more chambers that receives the fixture 302 and the components supported thereon. Once inside, the TCU 306 may provide a controllable ambient temperature environment for selectively melting and re-solidifying the first and second solder preforms 190, 192. The TCU 306 may comprise a reflow oven in some embodiments. In additional embodiments, the TCU 306 may include a so called "heat pen" that directs heated air at a predetermined location to melt the solder preforms 190, 192. Moreover, in some embodiments, the TCU 306 may direct cooled air at a predetermined location to re-solidify the material. In some embodiments, the TCU 306 may be single unit that both melts and re-solidifies the solder preforms 190, 192. Also, in some embodiments, the TCU 306 may include a conveyor (continuous moving belt, automated arm, etc.) that moves the components from a high-temperature station for melting the preforms 190, 192 and then through a low-temperature station for re-solidifying the solder preforms 190, 192. Once re-solidified, the first lead preform 180 may be attached to the first terminal end 130 at a first solder joint 194, and the second lead preform 180 may be attached to the second terminal end 132 at a second solder joint 196 (FIG. 5).

Moreover, attachment of the lead preforms 180, 182 to the SMD 104 (at 204 of the method 200) may include selective control of the rate of temperature change using the TCU 306. Stated differently, the TCU 306 may change temperature (heating and/or cooling) according to a predetermined ramp rate. For example, the TCU 306 may change temperature selectively according to a ramp rate of less than four degrees Celsius per second (4° C./s). In additional embodiments, the TCU 306 may change temperature according to a ramp rate of, at most, two degrees Celsius per second (2° C./s). Controlling temperature change in this way can protect the SMD 104 from damage due to thermal shock.

The method 200 may continue at 206, wherein the leads 110, 112 may be shaped. As shown in FIG. 5, the first bend 160 and the second bend 162 may be formed using a bending device 308 of the manufacturing system 300. The bending device 308 may include a first die 310 about which the preform 182 may be bent to form the first bend 160. The bending device 308 may also include a second die 312 about which the preform 182 may be bent to form the second bend 162. In some embodiments, the bending device 308 may form the first and/or second bends 160, 162 while the SMD 104 and preforms 180, 182 are supported in the fixture 302.

Figure 6:
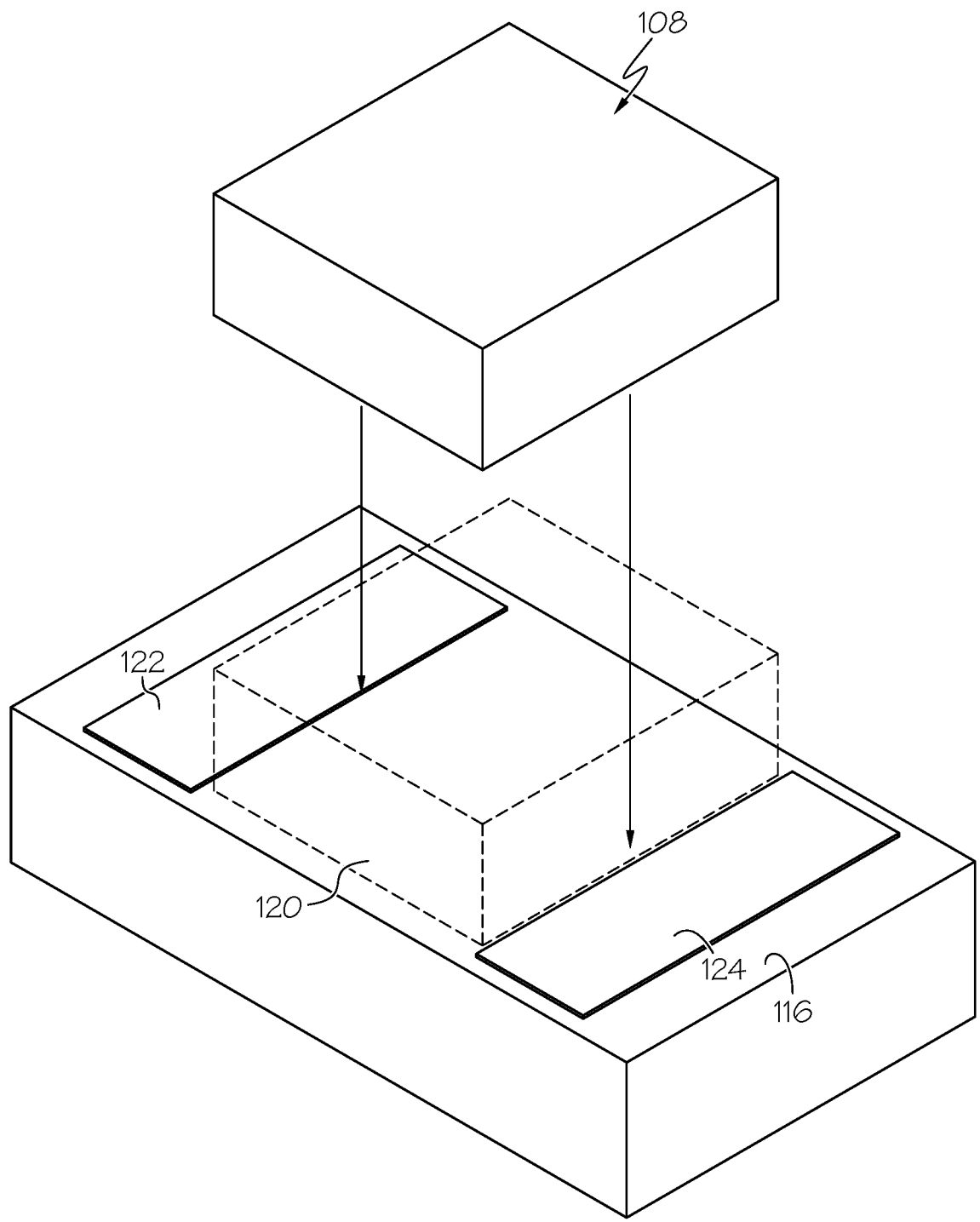
FIG. 6 is a perspective view of a circuit board and a spacer shown during manufacture of the circuit board assembly of FIG. 1.

Referring back to FIG. 2, the method 200 may include 208, wherein the spacer 108 is attached to the circuit board 102. As shown in FIG. 6, the spacer 108 may be layered and bonded to the mount area 120 between the first node 122 and the second node 124. As represented in FIG. 2, the spacer 108 may be attached to the circuit board 102 independently of 201-206 of the method 200. In some embodiments, the spacer 108 may be bonded to the mount area 120 using an adhesive (e.g., an epoxy).

Figure 7:
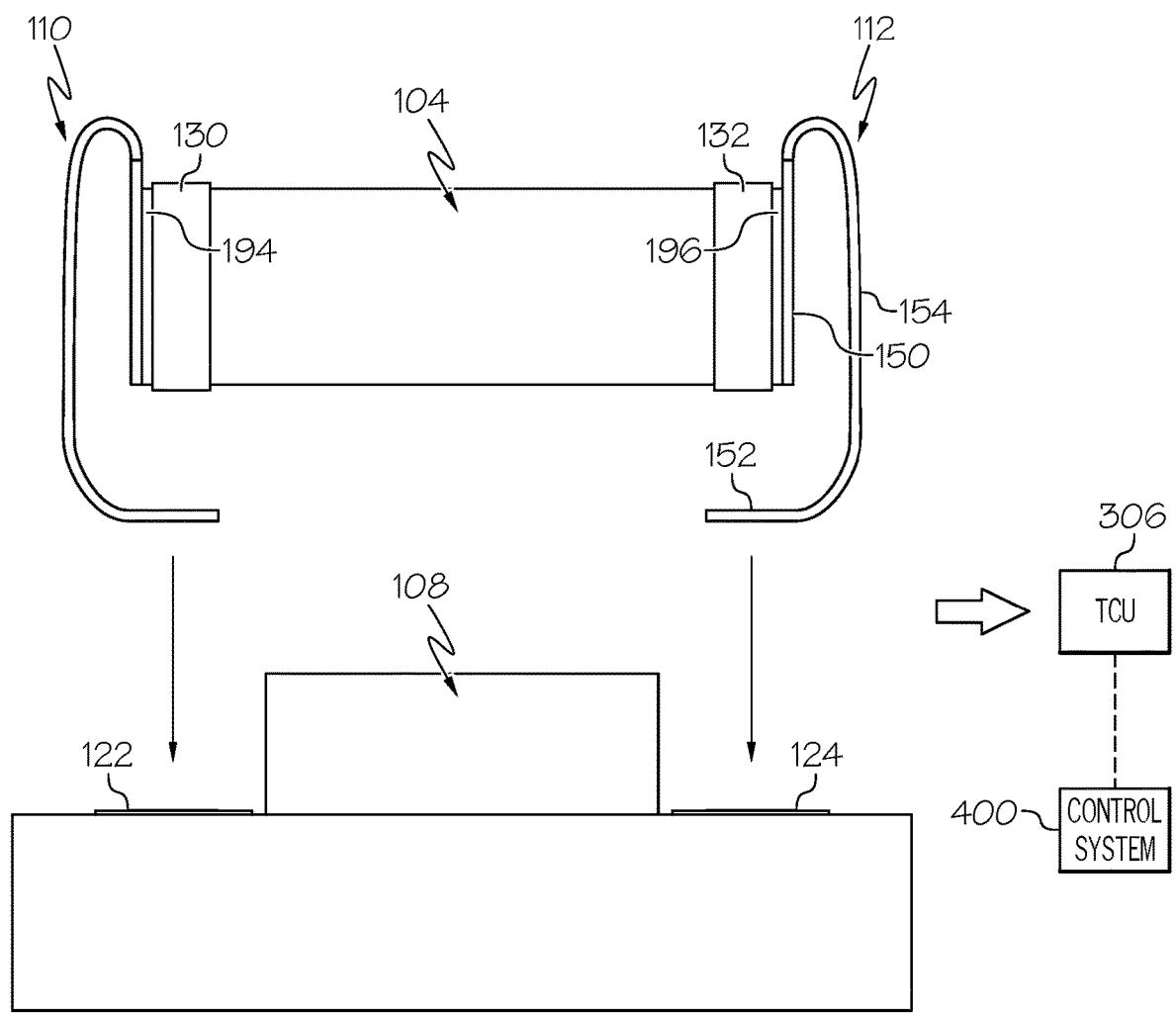
FIG. 7 is a side view showing the components of FIG. 5 being attached to the circuit board and spacer of FIG. 6.

Next, the method 200 may proceed to 210, wherein the SMD 104 is attached to the spacer 108. The SMD 104 may be layered over and bonded to the spacer 108 as shown in FIG. 7. In some embodiments, the SMD 104 may be attached to the spacer 108 via an adhesive (e.g., an epoxy). Then, at 212 of the method 200, the leads 110, 112 may be attached to the first and second nodes 122, 124. As represented in FIG. 7, the board connection ends 152 of the leads 110, 112 may be layered over the nodes 122, 124, respectively. Then, the TCU 306 may melt and re-solidify to attach the nodes 122, 124 to the board connection ends 152.

The method 200 may also include additional features, including pre-processing and/or post-processing of the circuit board assembly 100. For example, one or more through-holes 119 and conductive traces 117, 121 (FIG. 1) may be formed. The mount arrangement 106 may protect the SMD 104 during these portions of the method as well.

Accordingly, the mount arrangement 106 of the present disclosure provides robust support and electrical connection for the SMD 104. The mount arrangement 106 also protects the SMD 104 from thermal shock damage during its useful life and/or during manufacture of the circuit board assembly 100. The mount arrangement 106 may also facilitate manufacture of the circuit board assembly 100. The mount arrangement 106 may be used in newly designed assemblies 100. The mount arrangement 106 may also be used when repairing and replacing SMDs 104 on conventional circuit board assemblies 100.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A method of manufacturing a circuit board assembly comprising:
   attaching a flexible electrical lead to an electronic surface mount device (SMD) with a joining material, including selectively heating the joining material at a predetermined heating rate and selectively cooling the joining material at a predetermined cooling rate;
   attaching the SMD to a mount area of a circuit board using a spacer that is interposed between the mount area and the SMD, the spacer spacing the SMD at a distance from the mount area, a coefficient of thermal expansion (CTE) of the spacer being closer to a CTE of the SMD than a CTE of the circuit board; and
   attaching the flexible electrical lead to an electrical node of the circuit board.

2. The method of claim 1, wherein the SMD has a first coefficient of thermal expansion (CTE) and the spacer has a second CTE;
   wherein the second CTE is at least 60% of the first CTE; and
   wherein the second CTE is at most equal to the first CTE.

3. The method of claim 1, wherein the SMD is a multi-layer ceramic chip (MLCC) capacitor.

4. The method claim 1, wherein the lead is a thin, flexible strap of conductive material, and further comprising:
   attaching, at a first connection, a device connection end of the strap to a terminal end of the SMD;
   attaching, at a second connection, a board connection end of the strap to the electrical node of the circuit board; and
   freely extending an intermediate portion of the strap between the first connection and the second connection.

5. The method of claim 4, further comprising layering the device connection end of the strap on the terminal end of the SMD;
   further comprising layering the board connection end of the strap on the electrical node; and wherein the device connection end, at the first connection, extends transversely relative to the board connection end, at the second connection.

6. The method of claim 5, further comprising bending the strap; and further comprising extending the intermediate portion of the strap away from the first connection and the circuit board and to return the strap toward the second connection with the device connection end extending substantially normal to the board connection end.

7. The method of claim 1, wherein the MLCC and the spacer are made from a ceramic.

8. The method of claim 7, wherein the spacer is made of alumina ceramic (Aluminum Oxide).

9. The method of claim 8, wherein the lead is made of annealed copper.

10. A manufacturing system for manufacture of a circuit board assembly comprising:

a fixture that supports an electronic surface mount device (SMD), a flexible electrical lead, and a joining material together;

a temperature control unit that selectively controls a temperature of the joining material while the fixture supports the SMD, the electrical lead, and the joining material, the temperature control unit configured to selectively heat the joining material at a predetermined heating rate to melt the joining material, and to selectively cool the joining material at a predetermined cooling rate to re-solidify the joining material, thereby attaching the SMD and the electrical lead; and the temperature control unit configured to selectively melt and re-solidify a node material of a circuit board while the SMD is attached to a spacer that is interposed between the SMD and the circuit board, the temperature control unit configured to selectively heat the node material at the predetermined heating rate to melt the node material, and to selectively cool the node material at the predetermined cooling rate to re-solidify the node material, thereby attaching the electrical lead to an electrical node of the circuit board with the spacer spacing the SMD at a distance from a mount area of the circuit board.

* * * * *